(12) United States Patent
Liu et al.

(10) Patent No.: US 12,107,167 B2
(45) Date of Patent: Oct. 1, 2024

(54) HIGH-THRESHOLD POWER SEMICONDUCTOR DEVICE AND MANUFACTURING METHOD THEREOF

(71) Applicant: SOUTHEAST UNIVERSITY, Nanjing (CN)

(72) Inventors: Siyang Liu, Nanjing (CN); Weifeng Sun, Nanjing (CN); Chi Zhang, Nanjing (CN); Shuxuan Xin, Nanjing (CN); Shen Li, Nanjing (CN); Le Qian, Nanjing (CN); Chen Ge, Nanjing (CN); Longxing Shi, Nanjing (CN)

(73) Assignee: SOUTHEAST UNIVERSITY, Jiangsu (CN)

( * ) Notice: Subject to any disclaimer, the term of this patent is extended or adjusted under 35 U.S.C. 154(b) by 416 days.

(21) Appl. No.: 17/762,929

(22) PCT Filed: Jan. 20, 2021

(86) PCT No.: PCT/CN2021/072830
§ 371 (c)(1),
(2) Date: Mar. 23, 2022

(87) PCT Pub. No.: WO2022/062281
PCT Pub. Date: Mar. 31, 2022

(65) Prior Publication Data
US 2022/0367716 A1    Nov. 17, 2022

(30) Foreign Application Priority Data

Sep. 27, 2020   (CN) .......................... 202011036591.X

(51) Int. Cl.
*H01L 29/78*   (2006.01)
*H01L 29/10*   (2006.01)
(Continued)

(52) U.S. Cl.
CPC ...... *H01L 29/7851* (2013.01); *H01L 29/1095* (2013.01); *H01L 29/778* (2013.01); *H01L 29/8122* (2013.01)

(58) Field of Classification Search
None
See application file for complete search history.

(56) References Cited

U.S. PATENT DOCUMENTS

2014/0264562 A1*  9/2014  Cheng ................ H01L 29/7813
                                                          438/270
2016/0268446 A1*  9/2016  Bhalla ............... H01L 29/66068

FOREIGN PATENT DOCUMENTS

CN        104380442 A      2/2015
CN        108231898 A      6/2018
(Continued)

*Primary Examiner* — Cory W Eskridge
(74) *Attorney, Agent, or Firm* — MUNCY, GEISSLER, OLDS & LOWE, P.C.

(57) ABSTRACT

The present invention discloses a high-threshold power semiconductor device and a manufacturing method thereof. The high-threshold power semiconductor device includes, in sequence from bottom to top: a metal drain electrode, a substrate, a buffer layer, and a drift region; further including: a composite column body which is jointly formed by a drift region protrusion, a columnar p-region and a columnar n-region on the drift region, a channel layer, a passivation layer, a dielectric layer, a heavily doped semiconductor layer, a metal gate electrode and a source metal electrode. The composite column body is formed by sequentially depositing a p-type semiconductor layer and an n-type semiconductor layer on the drift region and then etching same. The channel layer and the passivation layer are formed in sequence by deposition. Thus, the above devices are divided into a cell region and a terminal region. The dielectric layer, the heavily doped semiconductor layer, the metal gate electrode and the source metal electrode only (Continued)

exist in the cell region, and the passivation layer of the terminal region extends upwards and is wrapped outside the channel layer. This structure can increase a threshold voltage of the device, improve the blocking characteristics of the device and reduce the size of a gate capacitance.

10 Claims, 19 Drawing Sheets

(51) Int. Cl.
*H01L 29/778* (2006.01)
*H01L 29/812* (2006.01)

(56) References Cited

FOREIGN PATENT DOCUMENTS

| | | |
|---|---|---|
| CN | 110998861 A | 4/2020 |
| CN | 111129119 A | 5/2020 |
| CN | 112164725 A | 1/2021 |

\* cited by examiner

HIGH-THRESHOLD POWER SEMICONDUCTOR DEVICE AND MANUFACTURING METHOD THEREOF

TECHNICAL FIELD

The present invention relates to the technical field of semiconductor devices, and in particular to a high-threshold voltage power semiconductor device and a manufacturing method thereof.

BACKGROUND

With the rapid development of semiconductor device materials and processes, power transistors are increasingly used in a variety of integrated circuits. Currently, mainstream power devices on the market mainly include silicon-laterally diffused metal oxide semiconductor devices, devices made of gallium arsenide, indium phosphide and silicon carbide materials, etc. Due to the limitation of the physical properties of the material itself, it is impossible to meet the application requirements. Therefore, it is urgent to develop power devices made of novel materials. As the representative of third-generation semiconductor materials, wide bandgap gallium nitride materials have become a research focus due to their excellent electrical and thermal properties. Gallium nitride devices have a wide application prospect due to their high electron mobility, high breakdown voltage, large current density, large power density, low noise and good frequency characteristics.

Conventional gallium nitride field effect transistors are classified into vertical and lateral structures. For a lateral structure device, in order to improve the device blocking capability, the active region distance needs to be increased, which tends to enlarge a chip area, and the performance of the device is susceptible to a surface state of a material. One of the typical vertical structures is a Fin FET device, which despite its relatively improved blocking capability, also faces a number of problems: Since electrons in the channel region are difficultly depleted, a threshold voltage of the device is small and the gate control capability is poor. In order to improve the blocking capability of the device, a general method adopted is to increase the length of a source field plate and a gate field plate, but a parasitic capacitance of the device will increase if the field plate is too long. Since electrons need to pass through the buffer layer from a source to a drain, an on-resistance tends to increase. In order to decrease the on-resistance, the concentration of the drift region has to be increased, which in turn decreases the blocking capability of the device.

As shown in FIG. 1, a conventional Fin FET device has a structure mainly including a metal drain electrode 1, a substrate 2, a buffer layer 3, a drift region 4, a heavily doped semiconductor layer 5c, a dielectric layer 6c, a metal gate electrode 7, a passivation layer 6b and a source metal electrode 8. In this structure, in a channel region above the drift region, channel electrons are depleted only by means of depleting a metal-semiconductor potential barrier, which causes the device to be normally off. Therefore, the threshold voltage is often low. To increase the threshold, it is common practice to reduce the width of the Fin FET, but this method has a higher requirement for an etching process. At the same time, in order to ensure a certain blocking characteristic of the device, the field plates of the metal gate electrode and the source metal electrode are indispensable and need to cover the terminal region. A relatively large metal area brings the problem of an increased gate capacitance, which will seriously affect the switching characteristics of the device. The low threshold and the high gate capacitance severely limit the applications of the Fin FET devices in high-voltage, high-power fields.

SUMMARY

In order to solve the problems faced by conventional Fin FET devices, such as a threshold voltage being small, a gate capacitance being high, and a breakdown voltage being unable to meet practical requirements, the present invention provides a high-threshold power semiconductor device capable of reducing an effective channel width of the device and a manufacturing method thereof.

The technical solutions of the present invention are as follows:

A high-threshold power semiconductor device according to the present invention includes: a metal drain electrode, a substrate, a buffer layer and a drift region which are stacked from bottom to top. A drift region protrusion protrudes from a partial region of the drift region; a columnar p-region and a columnar n-region are provided on the drift region protrusion in sequence; a composite column body is formed by the drift region protrusion, the columnar p-region and the columnar n-region; a channel layer is provided on an upper surface of the drift region, an outer side of the composite column body and a top of the composite column body; a passivation layer is provided on a bottom surface of the channel layer; a part of the drift region and a part of the channel layer, the passivation layer and the composite column body thereon are classified into a cell region; the other part of the drift region and a part of the channel layer, the passivation layer and the composite column body thereon are classified into a terminal region; a dielectric layer is provided on a surface of the passivation layer in the cell region and an outer side of the channel layer; a metal gate electrode is provided on an outer side of the dielectric layer; a heavily doped semiconductor layer is provided on a top surface of the channel layer in the cell region; a source metal electrode is provided on the heavily doped semiconductor layer; the passivation layer in the terminal region extends and is wrapped outside the channel layer in the terminal region.

Further, an upper surface of the passivation layer is not higher than a lower surface of the columnar p-region; an upper surface of the dielectric layer is not higher than an upper surface of the columnar n-region and is not lower than an upper surface of the columnar p-region; the lower surface of the columnar p-region is higher than a lower surface of the metal gate electrode; and an upper surface of the columnar p-region is lower than an upper surface of the metal gate electrode.

Further, a material of the channel layer is one of gallium nitride, aluminum gallium nitride and a graphene material, a concentration of which is not less than that of the drift region.

Further, the composite column body is a strip, or the composite column body is a cylinder; and each composite column body is arranged in a honeycomb shape.

A manufacturing method for the high-threshold power semiconductor device according to the present invention includes the following steps:

manufacturing of a wafer: growing a buffer layer and a drift region in sequence on a substrate to prepare a wafer;

formation of a composite column body in a columnar arrangement: epitaxially forming a p-type semiconductor layer and an n-type semiconductor layer on the drift region in sequence; then etching the p-type semiconductor layer, the n-type semiconductor layer and the drift region to form a composite column body which is arranged in parallel and is composed of a drift region protrusion, a columnar p-region and a columnar n-region which are stacked, wherein an etching depth of the drift region is equal to a thickness of the drift region protrusion; a thickness is 0.8-1.2 times a thickness of the columnar p-region;

manufacturing of a channel layer: depositing a layer of n-type gallium nitride material on an upper surface of the drift region, an outer side of the composite column body and a top of the composite column body by means of atomic layer deposition or chemical vapor deposition to prepare a channel layer;

manufacturing of a passivation layer: depositing a layer of oxide on a bottom of the channel layer by means of atomic layer deposition or chemical vapor deposition to form a passivation layer, wherein an upper surface of the passivation layer is not higher than a lower surface of the columnar p-region; a partial region of the channel layer and the passivation layer thereon are taken as a cell region, and the remaining region of the channel layer and the passivation layer thereon are taken as a terminal region;

manufacturing of a dielectric layer: depositing a layer of high-K dielectric material with a dielectric constant greater than that of silicon dioxide on a surface of the passivation layer and a side wall of the channel layer of the cell region by means of atomic layer deposition or chemical vapor deposition to prepare a dielectric layer, wherein the dielectric layer on the side wall of the channel layer is not higher than the upper surface of the columnar n-region and is not lower than the upper surface of the columnar p-region, and the upper surface at the bottom of the dielectric layer is not higher than the lower surface of the columnar p-region;

manufacturing of a metal gate electrode: depositing a metal on a side wall of the dielectric layer of the cell region by means of magnetron sputtering, so as to prepare a metal gate electrode, wherein an upper surface of the metal gate electrode is not higher than the upper surface of the columnar n-region;

manufacturing of a heavily doped semiconductor layer: depositing a layer of n-type gallium nitride on a top of the channel layer of the cell region by means of atomic layer deposition or chemical vapor deposition, and heavily doping the n-type gallium nitride with magnesium ions to prepare a heavily doped semiconductor layer, wherein a doping concentration of the magnesium ions is not less than the concentration of the drift region and is not greater than $2\times10^{19}$ cm$^{-3}$;

manufacturing of a source metal electrode: depositing a metal on the heavily doped semiconductor layer of the cell region by means of magnetron sputtering or electron beam evaporation, and forming an ohmic contact with a surface of the heavily doped semiconductor layer to prepare a source metal electrode;

manufacturing of a metal drain electrode: etching or grinding to thin the substrate, depositing a metal on a lower surface of the substrate by means of magnetron sputtering or electron beam evaporation, and forming an ohmic contact with the surface of the substrate to prepare a metal drain electrode; and completion of the extension of the passivation layer in the terminal region: depositing a layer of oxide on a surface of the passivation layer of the terminal region by means of atomic layer deposition or chemical vapor deposition, and causing the upper surface of the further deposited oxide to be not higher than the upper surface of the heavily doped semiconductor layer so that the passivation layer in the terminal region extends and is wrapped outside the channel layer in the terminal region.

Further, the metal gate electrode adopts a Ni/Au alloy or a Pt/Au alloy.

Further, the source metal electrode adopts a Ti/Au alloy or a Ti/Al/Ni/Au alloy.

Further, the dielectric material is gemstone, rutile, calcium titanate or magnesium titanate, and the high-K dielectric material has a dielectric constant greater than 3.7.

Compared to the prior art, the present invention has the following advantages.

(1) In the present invention, the columnar p-region 5a is provided in the composite column body, and the highly doped channel layer 6a formed by secondary deposition on the surface of the composite column body is used as a channel of the device and is shaped like a layer of thin shell, so that the channel layer of the present invention is extremely thin; when the device is in an on state, a breakover current passes through the thin-shell channel layer on the outer side of the columnar p-region 5a. Therefore, compared with a traditional structure, an effective channel width of the device is obviously reduced (referring to the channel layer 6a in FIG. 13).

(2) In the traditional structure, if the channel width of the device is smaller, a line width requirement for the process is higher. If a conductive channel is formed by a traditional etching method, the problems that it is difficult to control the bottom appearance of a trench and the risk of being unable to etch may occur. If the effective width of the device is reduced by forming a buried layer in a channel through an implantation process, there are problems such as difficult activation and easy lattice damage.

The present invention provides a manufacturing method for a columnar p-region, i.e. using deposition and etching greatly reduces the difficulty of the process. Firstly, the p-type semiconductor layer is formed by means of MOCVD (metal organic chemical vapor deposition), which is very suitable for growing various heterojunction materials, and the thickness is easy to control, so that the depth of the columnar p-region can be conveniently controlled by controlling the thickness of the p-type semiconductor layer, and at the same time, an epitaxial layer has good large-area uniformity. However, a conventional ion implantation process needs high-energy ion implantation with higher dosage to achieve the same doping concentration, so that it is technically difficult to achieve large-area high-concentration implantation. Furthermore, the high-energy ion implantation will bring more lattice damages; it is difficult to control an ion implantation depth; and its cost is higher than that of the MOCVD. Secondly, by etching the p-type semiconductor layer to form the columnar p-region, according to the etching process, the diameter size of the columnar p-region can be conveniently determined, and the requirement for a line width is lower, so that the etching process can be performed in the current technological level. After the diameter size of the columnar p-region is determined, the width of the conductive channel is only determined by the thickness of the conductive material deposited on the outer side of the columnar p-region. If a conductive channel region is formed directly by etching, a very small channel region width cannot be achieved, and it is difficult to control the channel depth.

The specific steps are as follows: epitaxially forming the columnar p-region 5a and the columnar n-region 5b on the drift region in sequence; etching the columnar p-region 5a and the columnar n-region 5b in parallel at a certain interval to form a plurality of columnar p-regions 5a and columnar n-regions 5b which are arranged in parallel and cylindrically extend; depositing a layer of n-type gallium nitride material on surfaces of the columnar p-regions 5a and columnar n-regions 5b to prepare the channel layer 6a.

(3) Compared with a traditional structure, the present invention has a smaller effective channel width, thereby enhancing the effect of the Schottky barrier generated by the metal-semiconductor contact. At the same time, since the p-type region 5a can further deplete the electrons in the channel, the two effects are superimposed on each other, which further reduces the concentration of the electrons in the channel region. Therefore, the threshold of the device can be greatly increased under the current process conditions (i.e., without reducing the total width of the channel).

(4) The present invention can effectively improve the capacitance characteristics of the device, so that the switching characteristics of the device are further improved. The traditional structure relies heavily on a large-area source field plate to reduce an electric field at the bottom of the trench, so as to ensure higher blocking capability of the device, but it greatly increases the parasitic capacitance of the device, resulting in poor switching characteristics. The present invention ingeniously uses the columnar p-region 5a to reduce the electric field at the bottom of the trench, so as to ensure the blocking capability of the device to a certain extent. At the same time, the columnar p-region replaces the source field plate, which greatly reduces the capacitance of the device and optimizes the switching characteristics of the device.

(5) In the present invention, due to the presence of the columnar p-region 5a, the concentration of the drift region can be further increased under the same blocking requirement, thereby greatly reducing the on-resistance while avoiding the waste of the margin of the breakdown voltage.

(6) The composite column body structures in the present invention are arranged in a honeycomb pattern on the upper surface of the buffer layer, which meets a requirement for a minimum size of a through hole in the process requirements. The lateral area of the device can be used to the maximum extent. Since a plurality of fin-type region units exist on the buffer layer, a multi-channel current is generated, so that the current capability is effectively improved, and the device obtains a higher on-state current when it is turned on, thereby reducing the on-resistance of the device.

DETAILED DESCRIPTION

Figure 1:
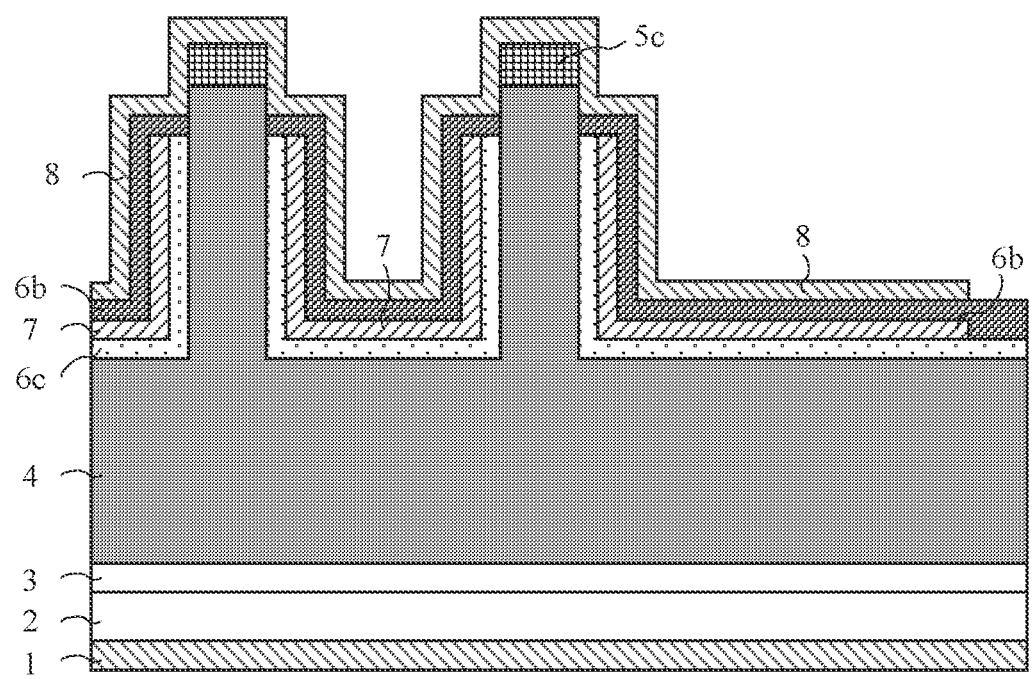
FIG. 1 is a front sectional view of a conventional Fin FET device.

The following describes embodiments of the present invention with reference to the accompanying drawings. It should be understood that the embodiments are described herein to merely explain and illustrate the present invention, and are not intended to limit the present invention.

Embodiment 1

A high-threshold power semiconductor device according to the present invention includes: a metal drain electrode 1, a substrate 2, a buffer layer 3 and a drift region 4 which are stacked from bottom to top. A drift region protrusion 4a protrudes from a partial region of the drift region 4; a columnar p-region 5a and a columnar n-region 5b are provided on the drift region protrusion 4a in sequence; a composite column body is formed by the drift region protrusion 4a, the columnar p-region 5a and the columnar n-region 5b; a channel layer 6a is provided on an upper surface of the drift region 4, an outer side of the composite column body and a top of the composite column body; a passivation layer 6b is provided on a bottom surface of the channel layer 6a; a part of the drift region 4 and a part of the channel layer 6a, the passivation layer 6b and the composite column body thereon are classified into a cell region 9; the other part of the drift region 4 and a part of the channel layer 6a, the passivation layer 6b and the composite column body thereon are classified into a terminal region 10; a dielectric layer 6c is provided on a surface of the passivation layer 6b in the cell region 9 and an outer side of the channel layer 6a; a metal gate electrode 7 is provided on an outer side of the dielectric layer 6c; a heavily doped semiconductor layer 5c is provided on a top surface of the channel layer 6a in the cell region 9; a source metal electrode 8 is provided on the heavily doped semiconductor layer 5c; the passivation layer 6b in the terminal region 10 extends and is wrapped outside the channel layer 6a in the terminal region 10.

In this embodiment, an upper surface of the passivation layer 6b is not higher than a lower surface of the columnar p-region 5a; an upper surface of the dielectric layer 6c is not higher than an upper surface of the columnar n-region 5b and is not lower than an upper surface of the columnar p-region 5a; the lower surface of the columnar p-region 5a is higher than a lower surface of the metal gate electrode 7; and an upper surface of the columnar p-region 5a is lower than an upper surface of the metal gate electrode 7.

A material of the channel layer 6a is one of gallium nitride, aluminum gallium nitride and a graphene material, a concentration of which is not less than that of the drift region 4.

The composite column body is a strip, or the composite column body is a cylinder; and each composite column body is arranged in a honeycomb shape.

The dielectric laver 6c may be $Al_2O_3$ or other materials.

The passivation layer 6b may be $SiO_2$ or other materials, constituting a single-layer structure or a combined multilayer structure, playing an isolation role and a role of improving the blocking.

The metal drain electrode 1 is in ohmic contact with a surface of the substrate 2, and serves as a current output port w % ben the high-threshold power semiconductor device is turned on. The source metal electrode 8 is in ohmic contact with a surface of the heavily doped semiconductor layer 5c, and serves as a current input port when the high-threshold power semiconductor device is turned on.

A concentration and thickness of the buffer layer 3 determine the blocking characteristic, and the blocking characteristic can be improved by appropriately reducing the doping concentration of the buffer layer 3 or increasing the thickness of the buffer laver 3.

The metal gate electrode 7 is used to regulate an electron concentration in a fin-type channel to control the turn-on and turn-off of the gallium nitride semiconductor device.

A manufacturing method for the high-threshold power semiconductor device according to the present invention includes the following steps.

manufacturing of a wafer: a buffer layer 3 and a drift region 4 grow in sequence on a substrate 2 to prepare a wafer;

formation of a composite column body in a columnar arrangement: a p-type semiconductor layer and an n-type semiconductor layer are epitaxially formed on the drift region 4 in sequence; the p-type semiconductor layer, the n-type semiconductor layer and the drift region 4 are then etched to form a composite column body which is arranged in parallel and is composed of a drift region protrusion 4a, a columnar p-region 5a and a columnar n-region 5b which are stacked, wherein an etching depth of the drift region 4 is equal to a thickness of the drift region protrusion 4a; a thickness is 0.8-1.2 times a thickness of the columnar p-region 5a;

manufacturing of a channel layer 6a: a layer of n-type gallium nitride material is deposited on an upper surface of the drift region 4, an outer side of the composite column body and a top of the composite column body by means of atomic layer deposition or chemical vapor deposition to prepare a channel layer 6a; in this way, the channel layer 6a formed on the surface of the composite column body shows a layer of thin shell that is wrapped outside the composite column body and has an extremely small thickness; it can be seen that an effective channel width of the present invention can be made to be extremely small;

manufacturing of a passivation layer 6b: a layer of oxide is deposited on a bottom of the channel layer 6a by means of atomic layer deposition or chemical vapor deposition to form a passivation layer 6b, wherein an upper surface of the passivation layer 6b is not higher than a lower surface of the columnar p-region 5a; a partial region of the channel layer 6a and the passivation layer thereon are taken as a cell region 9, and the remaining region of the channel layer 6a and the passivation layer thereon are taken as a terminal region 10;

manufacturing of a dielectric layer 6c: a layer of high-K dielectric material with a dielectric constant greater than that of silicon dioxide on a surface of the passivation layer 6b and a side wall of the channel layer 6a of the cell region 9 by means of atomic layer deposition or chemical vapor deposition to prepare a dielectric layer 6c, wherein the dielectric layer 6c on the side wall of the channel layer 6a is not higher than the upper surface of the columnar n-region 5b and is not lower than the upper surface of the columnar p-region 5a, and the upper surface at the bottom of the dielectric layer 6c is not higher than the lower surface of the columnar p-region 5a;

manufacturing of a metal gate electrode 7: a metal is deposited on a side wall of the dielectric layer 6c of the cell region 9 by means of magnetron sputtering, so as to prepare a metal gate electrode 7, wherein an upper surface of the metal gate electrode is not higher than the upper surface of the columnar n-region 5b;

manufacturing of a heavily doped semiconductor layer 5c: a layer of n-type gallium nitride is deposited on a top of the channel layer 6a of the cell region 9 by means of atomic layer deposition or chemical vapor deposition, and the n-type gallium nitride is heavily doped with magnesium ions to prepare a heavily doped semiconductor layer 5c, wherein a doping concentration of the magnesium ions is not less than the concentration of the drift region 4 and is not greater than $2\times10^{19}$ $cm^{-3}$;

manufacturing of a source metal electrode 8: a metal is deposited on the heavily doped semiconductor layer 5c of the cell region 9 by means of magnetron sputtering or electron beam evaporation, and an ohmic contact with a surface of the heavily doped semiconductor layer 5c is formed to prepare a source metal electrode 8;

manufacturing of a metal drain electrode 1: the substrate (2) is thinned by etching or grinding; a metal is deposited on a lower surface of the substrate 2 by means of magnetron sputtering or electron beam evaporation, and an ohmic contact with the surface of the substrate (2) is formed to prepare a metal drain electrode 1;

completion of the extension of the passivation layer 6b: a layer of oxide is deposited on a surface of the passivation layer 6b of the terminal region 10 by means of atomic layer deposition or chemical vapor deposition, and the upper surface of the further deposited oxide is caused to be not higher than the upper surface of the heavily doped semiconductor layer 5c so that the passivation layer 6b in the terminal region 10 extends and is wrapped outside the channel layer 6a in the terminal region 10.

In this embodiment, further, the metal gate electrode 7 adopts a Ni/Au alloy or a Pt/Au alloy.

Further, the source metal electrode 8 adopts a Ti/Au alloy or a Ti/Al/Ni/Au alloy.

Further, the dielectric material is gemstone, rutile, calcium titanate or magnesium titanate, and the high-K dielectric material has a dielectric constant greater than 3.7.

Figure 2:
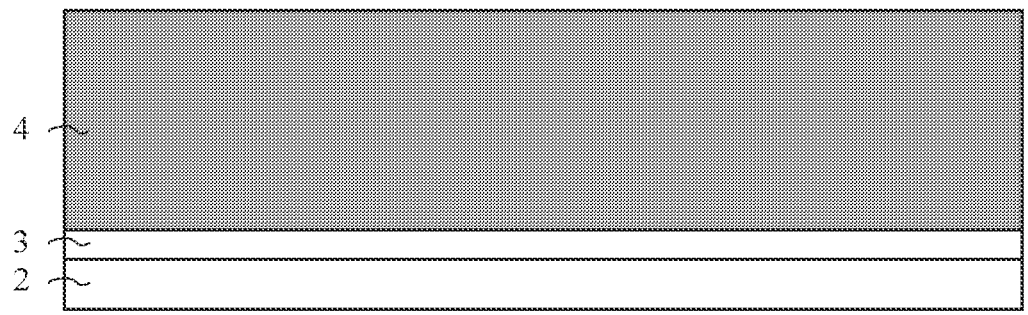
FIG. 2 is a schematic diagram I of a manufacturing method of a high-threshold power semiconductor device according to the present invention.

The following statement is made with respect to this embodiment with reference to the accompanying drawings:

As shown in FIG. 2, the buffer layer 3 and the drift region 4 grow on the substrate 2 in sequence to prepare the wafer.

Figure 3:
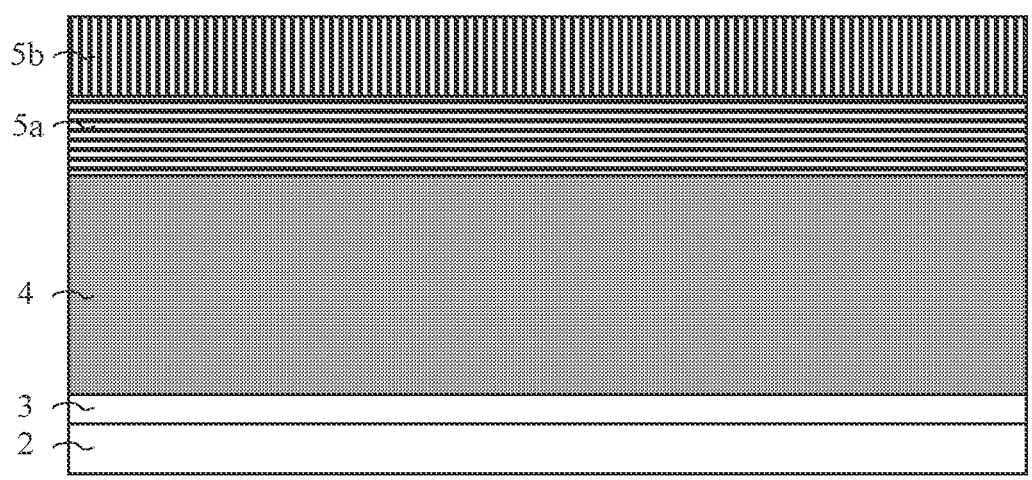
FIG. 3 is a schematic diagram II of a manufacturing method of a high-threshold power semiconductor device according to the present invention.

As shown in FIG. 3, a layer of p-type semiconductor layer is first epitaxially formed on the drift region 4 by means of chemical vapor deposition. A layer of n-type semiconductor layer is then epitaxially formed on the p-type semiconductor layer by means of the chemical vapor deposition and has the same thickness as that of the p-type semiconductor layer.

Figure 4:
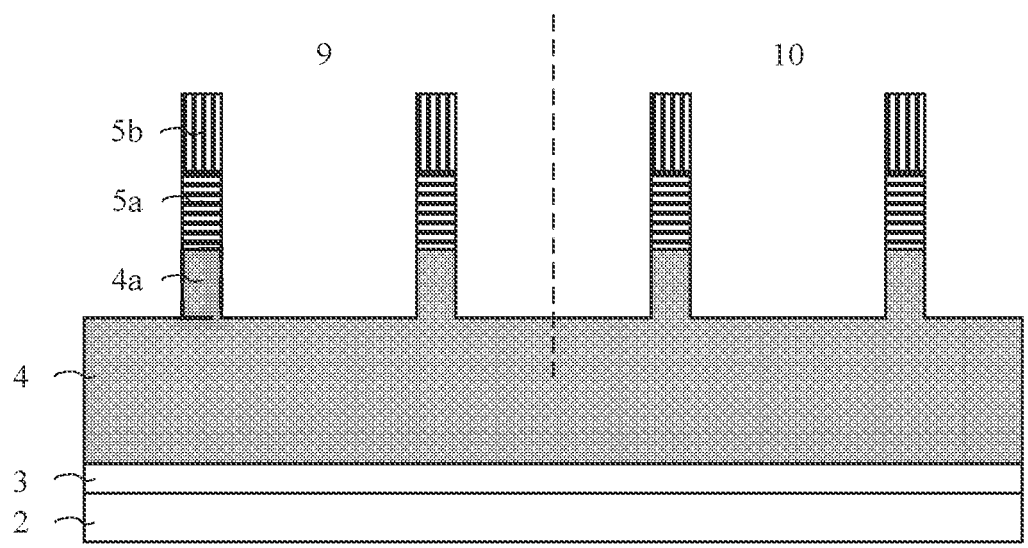
FIG. 4 is a schematic diagram III of a manufacturing method of a high-threshold power semiconductor device according to the present invention.

As shown in FIG. 4, the p-type semiconductor layer and the n-type semiconductor layer are etched until the drift region 4 are exposed to form a plurality of columnar p-regions 5a and columnar n-regions 5b which are arranged in parallel and cylindrically extend. The etching is continued to form a series of drift region protrusions 4a arranged in parallel on lower surfaces of the columnar p-regions 5a, and the columnar p-regions 5a, the columnar n-regions 5b and the drift region protrusions 4a together constitute composite column bodies.

Figure 5:
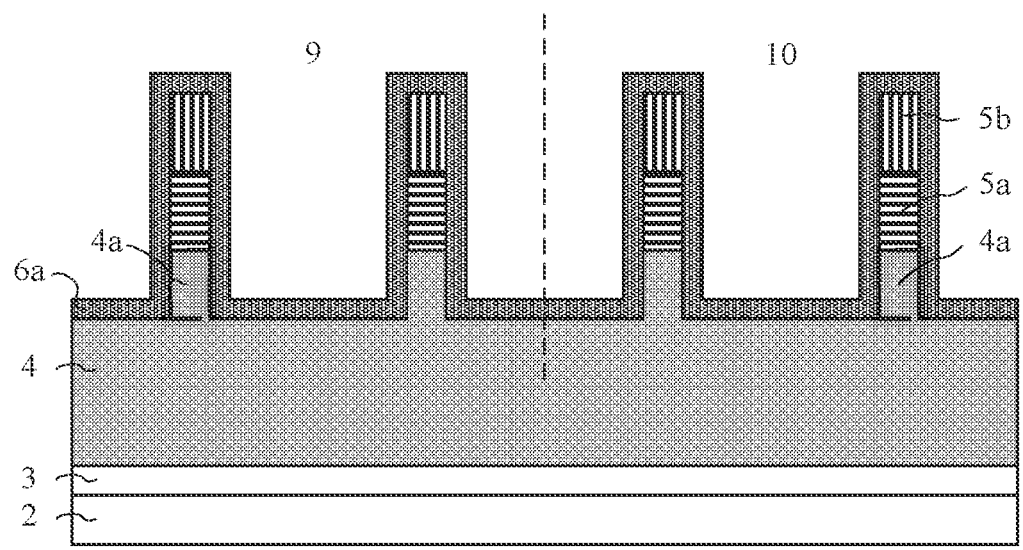
FIG. 5 is a schematic diagram IV of a manufacturing method of a high-threshold power semiconductor device according to the present invention.

As shown in FIG. 5, a layer of n-type gallium nitride material is deposited on an upper surface of the drift region 4, outer sides of the composite column bodies and tops of the composite column bodies by means of atomic layer deposition or chemical vapor deposition is used to deposit, so as to prepare a channel layer 6a.

Figure 6:
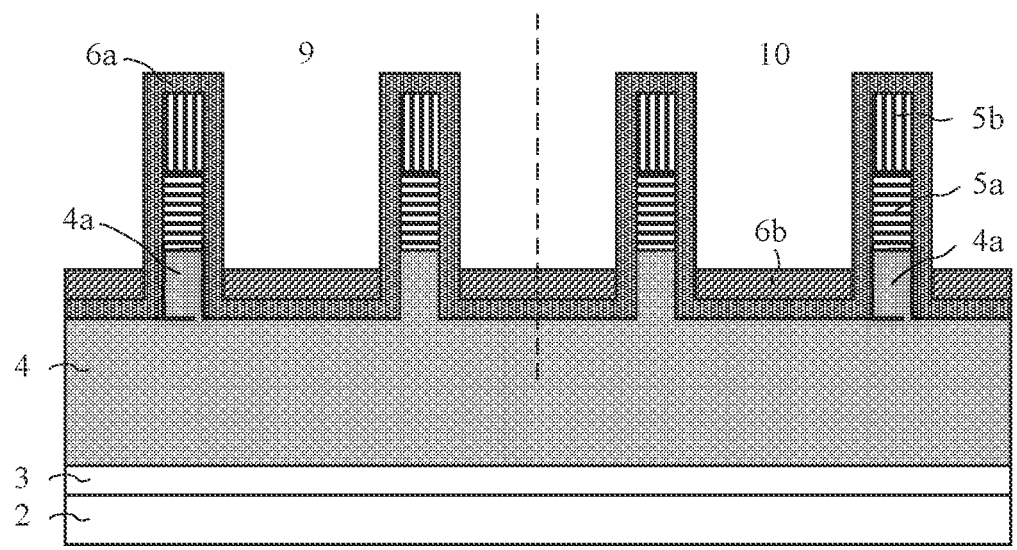
FIG. 6 is a schematic diagram V of a manufacturing method of a high-threshold power semiconductor device according to the present invention.

As shown in FIG. 6, a layer of oxide is deposited on a bottom of the channel layer 6a by means of atomic layer deposition or chemical vapor deposition to form a passivation layer 6b. An upper surface of the passivation layer 6b is not higher than a lower surface of the columnar p-region 5a.

Figure 7:
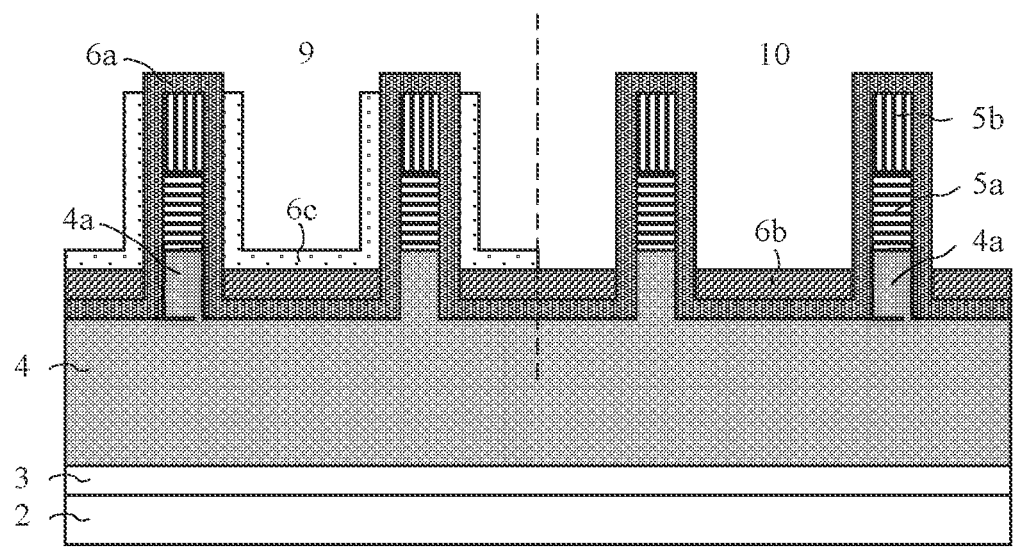
FIG. 7 is a schematic diagram VI of a manufacturing method of a high-threshold power semiconductor device according to the present invention.

As shown in FIG. 7, a layer of high-K dielectric material with a dielectric constant greater than that of silicon dioxide (the dielectric constant of which is 3.7) on a surface of the passivation layer 6b and a side wall of the channel layer 6a of the cell region 9 by means of atomic layer deposition or chemical vapor deposition to prepare a dielectric layer 6c. The dielectric layer 6c on the side wall of the channel layer 6a is not higher than the upper surface of the columnar n-region 5b and is not lower than the upper surface of the columnar p-region 5a, and the lower surface at the bottom of the dielectric layer 6c is not higher than the upper surface of the columnar p-region 5a.

Figure 8:
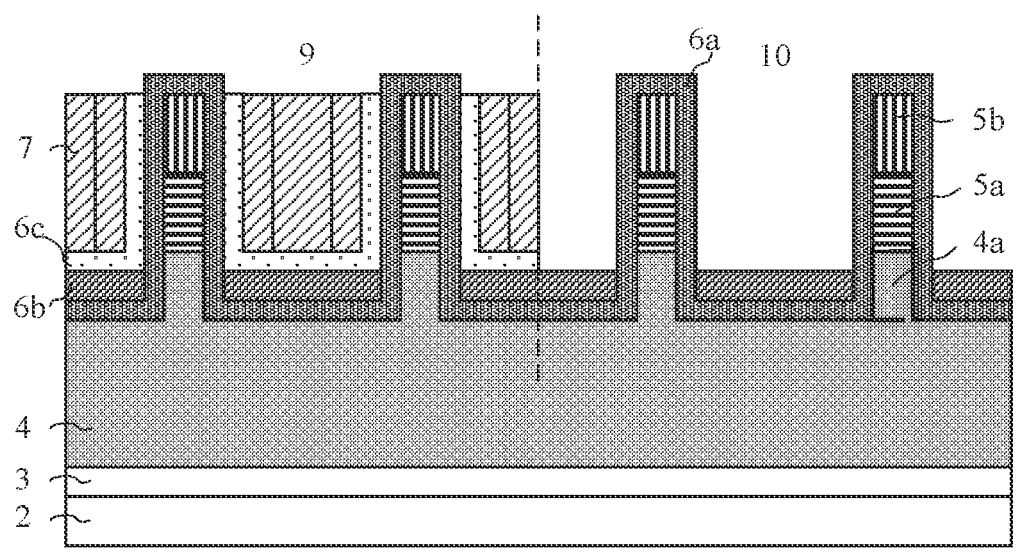
FIG. 8 is a schematic diagram VII of a manufacturing method of a high-threshold power semiconductor device according to the present invention.

As shown in FIG. 8, a metal is deposited on a side wall of the dielectric layer 6c of the cell region 9 by means of magnetron sputtering to prepare a metal gate electrode 7. The upper surface of the metal gate electrode is not higher than the upper surface of the columnar n-region 5b, and the metal gate electrode 7 may be a Ni/Au alloy or a Pt/Au alloy.

Figure 9:
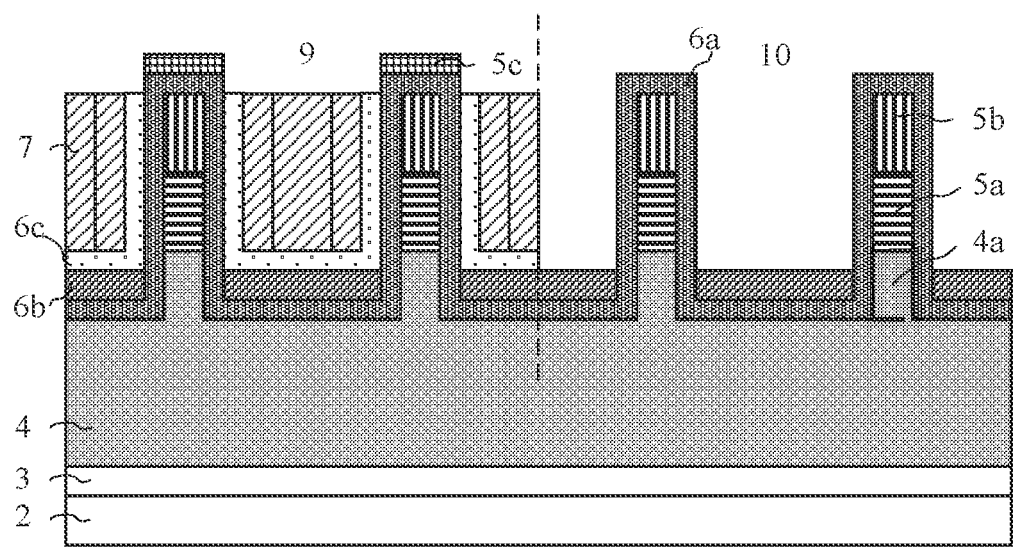
FIG. 9 is a schematic diagram VIII of a manufacturing method of a high-threshold power semiconductor device according to the present invention.

As shown in FIG. 9, a layer of n-type gallium nitride material is deposited on a top surface of the channel layer 6a of the cell region 9 by means of atomic layer deposition or chemical vapor deposition, and the region is heavily doped to prepare a heavily doped semiconductor layer 5c.

Figure 10:
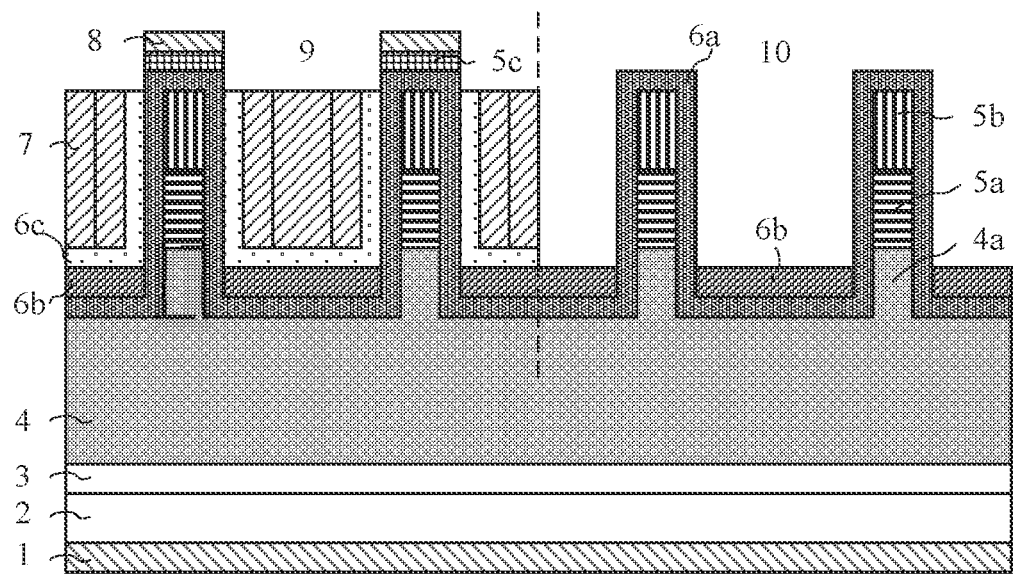
FIG. 10 is a schematic diagram IX of a manufacturing method of a high-threshold power semiconductor device according to the present invention.

As shown in FIG. 10, a metal is deposited on the heavily doped semiconductor layer 5c by means of magnetron sputtering or electron beam evaporation, and an ohmic contact is formed with a surface of the heavily doped semiconductor layer 5c to prepare a source metal electrode 8. The source metal electrode 8 may be a Ti/Au alloy or a Ti/AU/Ni/Au alloy. The substrate 2 is thinned by etching or grinding. A metal is deposited on a lower surface of the substrate 2 by means of magnetron sputtering or electron beam evaporation, and an ohmic contact is formed with a surface of the substrate 2 to prepare a metal drain electrode 1.

Figure 11:
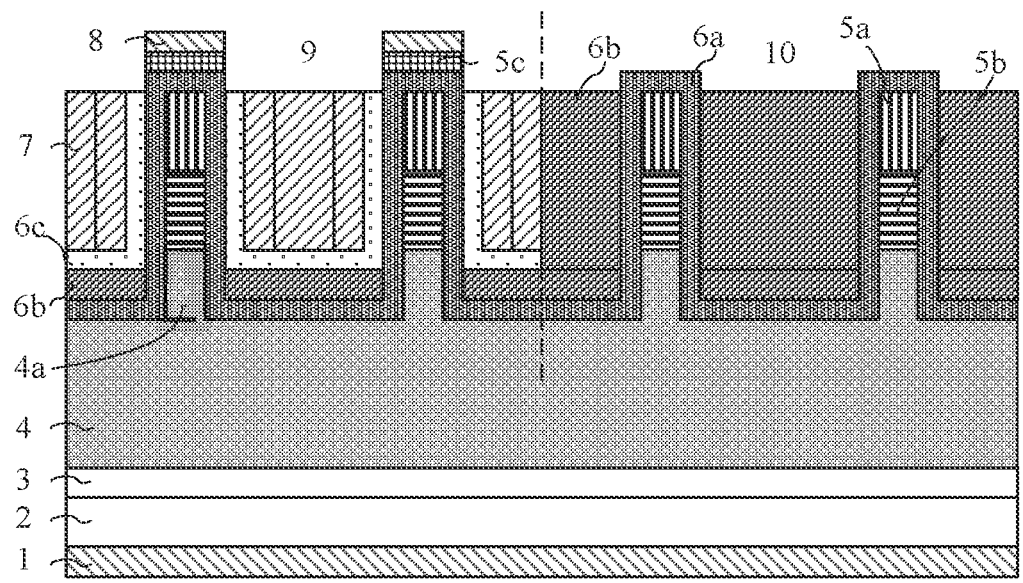
FIG. 11 is a schematic diagram X of a manufacturing method of a high-threshold power semiconductor device according to the present invention.

As shown in FIG. 11, a layer of oxide is deposited on a surface of the passivation layer 6b of the terminal region 10 by means of atomic layer deposition or chemical vapor deposition, and the upper surface of the further deposited oxide is caused to be not higher than the upper surface of the heavily doped semiconductor layer 5c so that the passivation layer 6b in the terminal region 10 extends and is wrapped outside the channel layer 6a in the terminal region 10.

Figure 12:
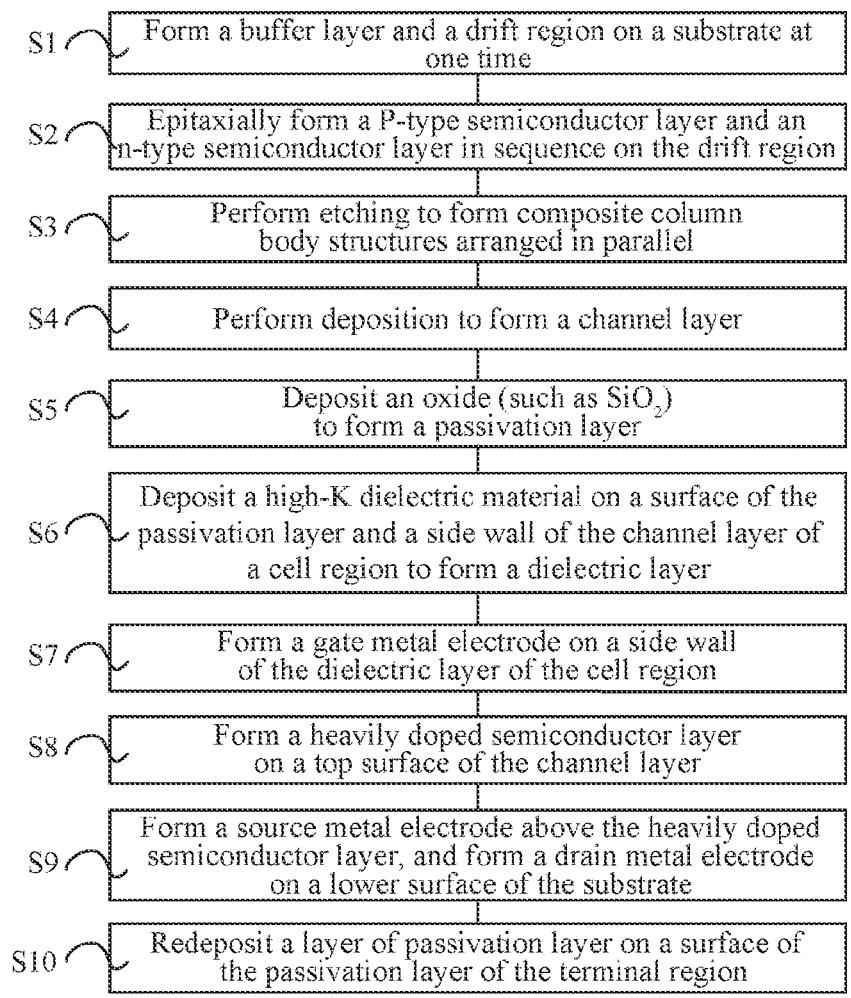
FIG. 12 is a flow chart of a manufacturing method of a high-threshold power semiconductor device according to the present invention.

As shown in FIG. 12, a flow chart of a manufacturing method of a high-threshold power semiconductor device includes, but is not limited to, the important steps shown in the figures.

Figure 13:
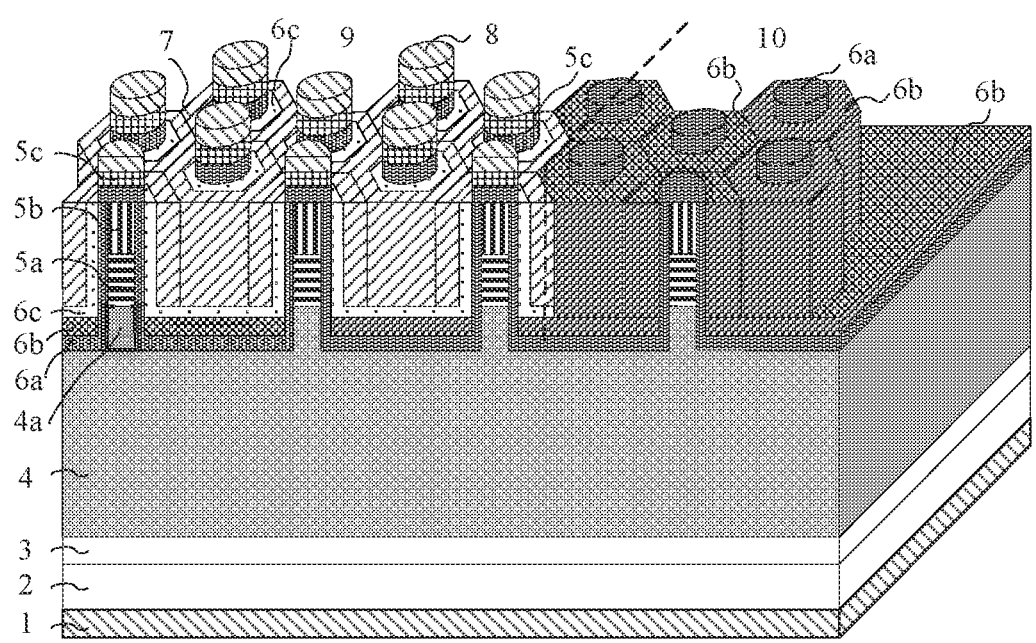
FIG. 13 illustrates a front sectional three-dimensional diagram of a high-threshold power semiconductor device with a fin-type region in a honeycomb arrangement according to one embodiment.

As shown in FIG. 13, a front sectional three-dimensional diagram of the high-threshold power semiconductor device of this embodiment is illustrated. The composite column bodies are in a honeycomb arrangement. The honeycomb arrangement structure satisfies a requirement for a minimum size of a through hole in the process requirements. The lateral area of the device can be used to the maximum extent.

Embodiment 2

Figure 14:
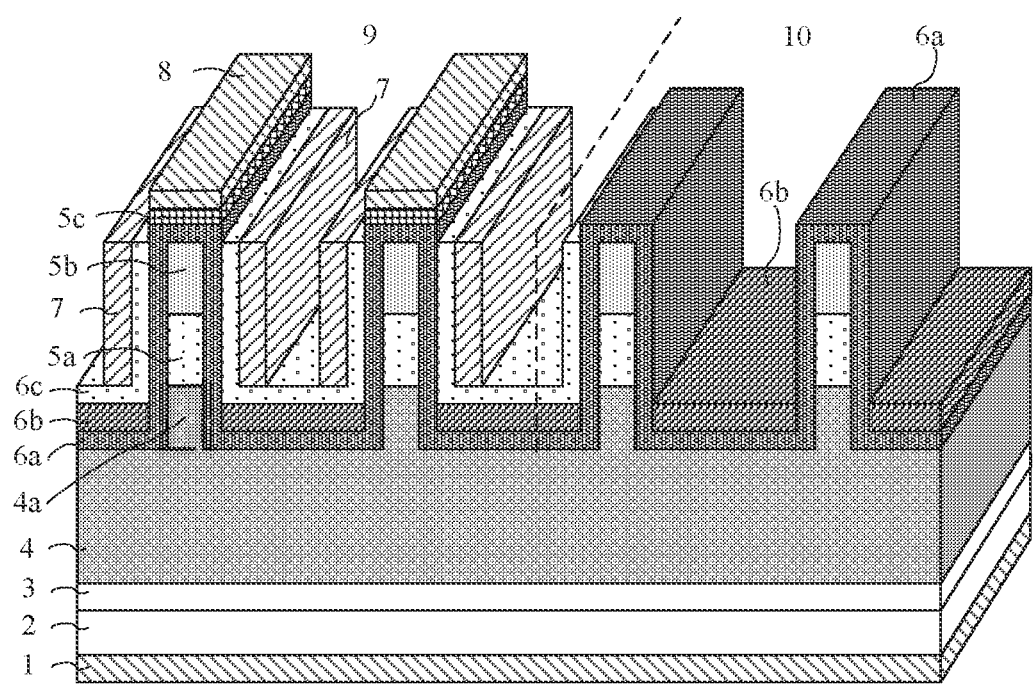
FIG. 14 illustrates a front sectional three-dimensional diagram of a high-threshold power semiconductor device with a fin-type region arranged in a manner of inserted straight bars according to one embodiment.

Referring to FIG. 14, compared with Embodiment 1, this embodiment differs in that the columnar p-regions 5a, the columnar n-regions 5b, the channel layer 6a, the heavily doped semiconductor layer 5c, the passivation layer 6b, the dielectric layer 6c, the metal gate electrode 7, and the source metal electrode 8 of the high-threshold power semiconductor device are distributed in a manner of inserted straight bars. Without the passivation layer 6b1, and other structures are the same as those in Embodiment 1. The manufacturing process of the inserted straight bar distribution is simpler, and metal interconnect lines are reduced.

Embodiment 3

Figure 15:
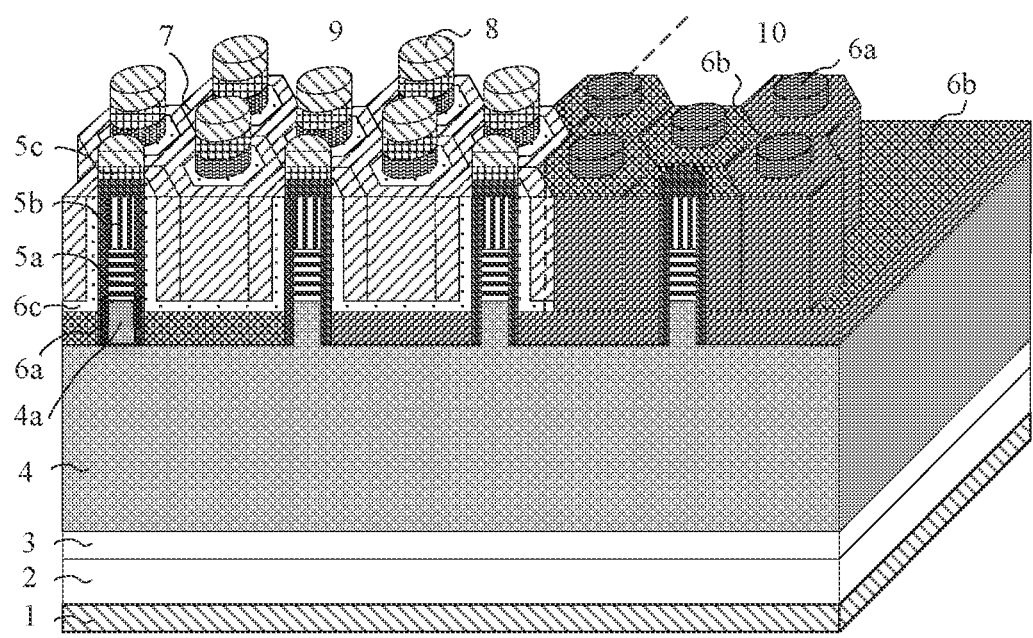
FIG. 15 illustrates a front sectional three-dimensional diagram of a high-threshold power semiconductor device with channel layer made of a graphene material according to one embodiment.

Referring to FIG. 15, this embodiment differs from Embodiment 1 in that the channel layer 6a of the high-threshold power semiconductor device is a graphene material, and other structures are the same as those in Embodiment 1. Graphene has extremely high strength and flexibility, which improves the stability of the device. The thermal conductivity of graphene is higher than that of the gallium nitride material, so the temperature stability is higher. Graphene is the most highly conductive material at a room temperature, with an electron mobility about 140 times that of silicon and lower than that of copper or silver. The conductivity is up to $10^6$ S/m, so it has a lower on-resistance under the same conditions.

Embodiment 4

Figure 16:
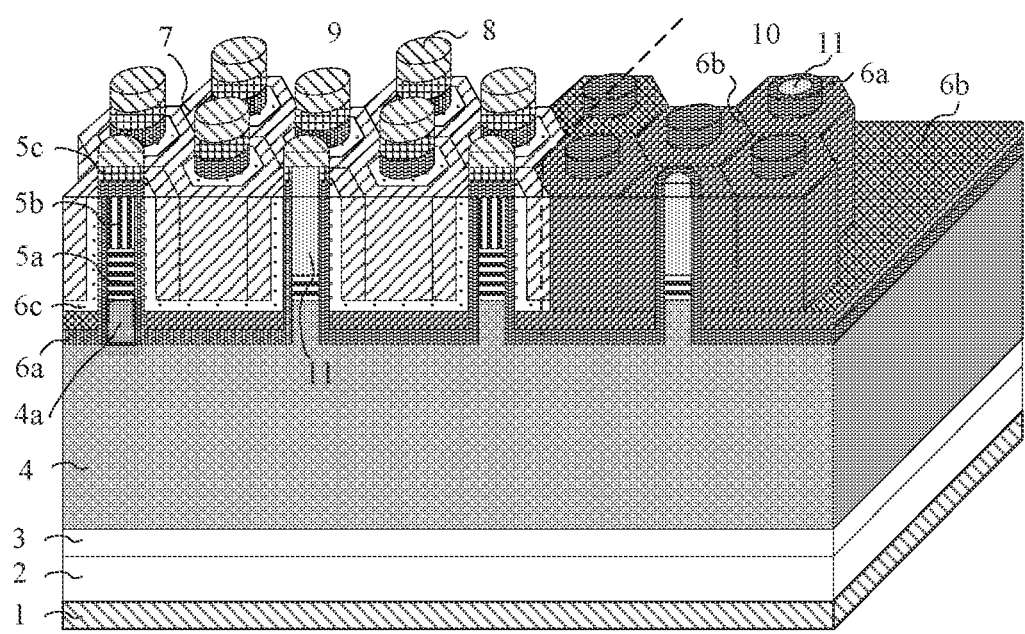
FIG. 16 illustrates a front sectional three-dimensional diagram of a high-threshold power semiconductor device with a p buried layer of a terminal region that is grounded according to one embodiment.
Figure 17:
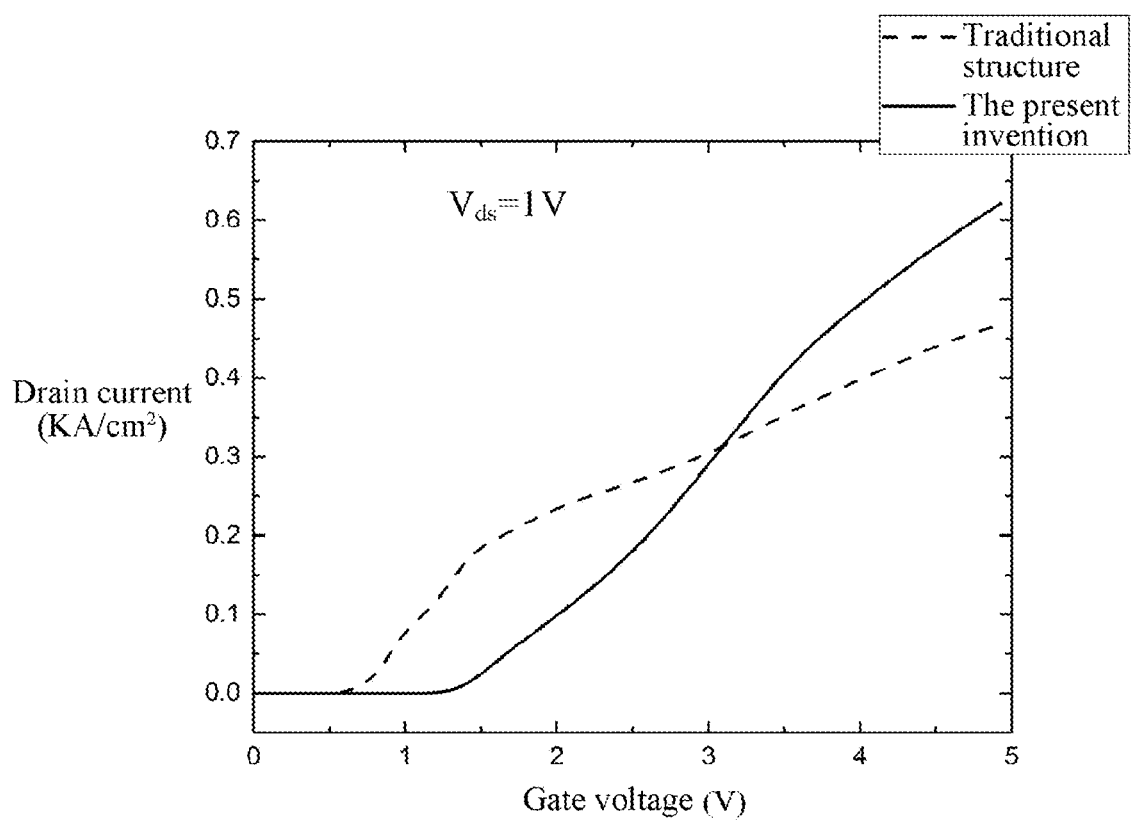
FIG. 17 is a comparison diagram of a threshold voltage of the present invention to that of a traditional vertical gallium nitride semiconductor device. It can be seen from the diagram that the threshold voltage of the present invention is approximately increased to 1.5 V.
Figure 18:
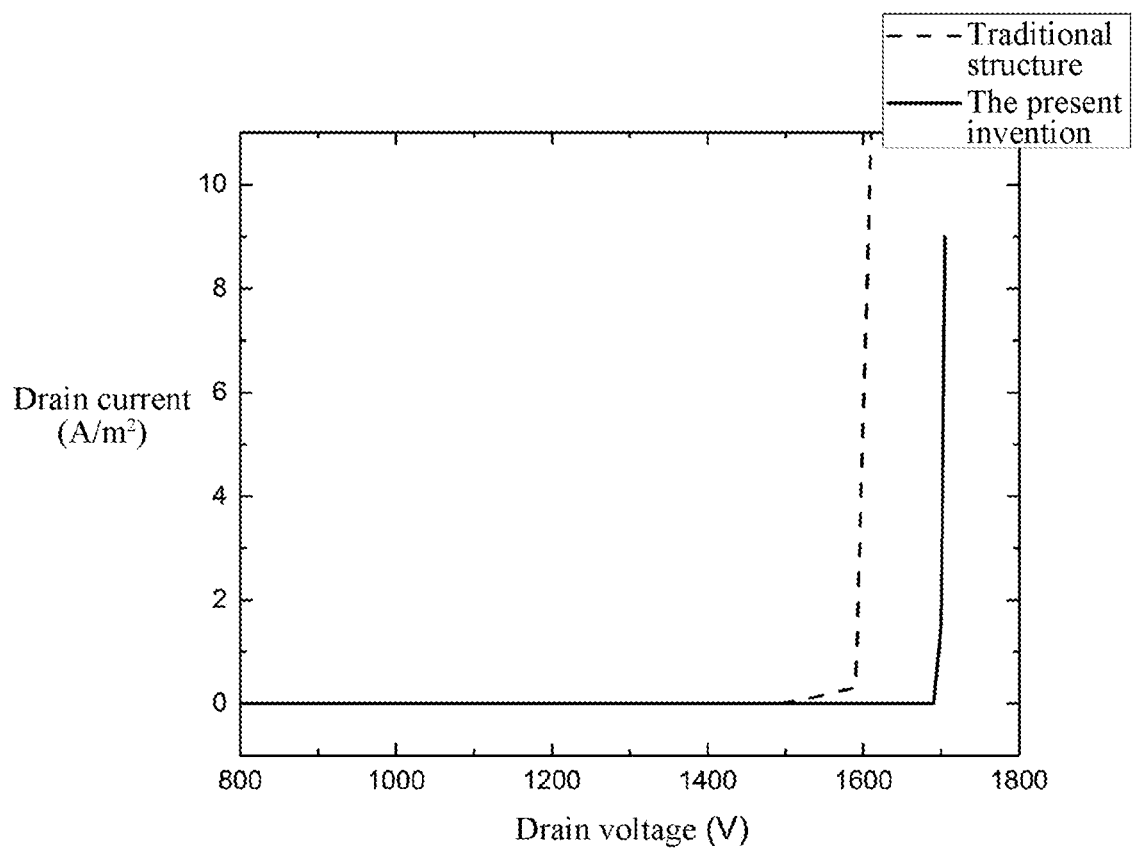
FIG. 18 is a comparison diagram of a breakover voltage of the present invention to that of a traditional vertical gallium nitride semiconductor device. It can be seen from the diagram that the breakover voltage of the present invention is obviously greater than that of the traditional device.
Figure 19:
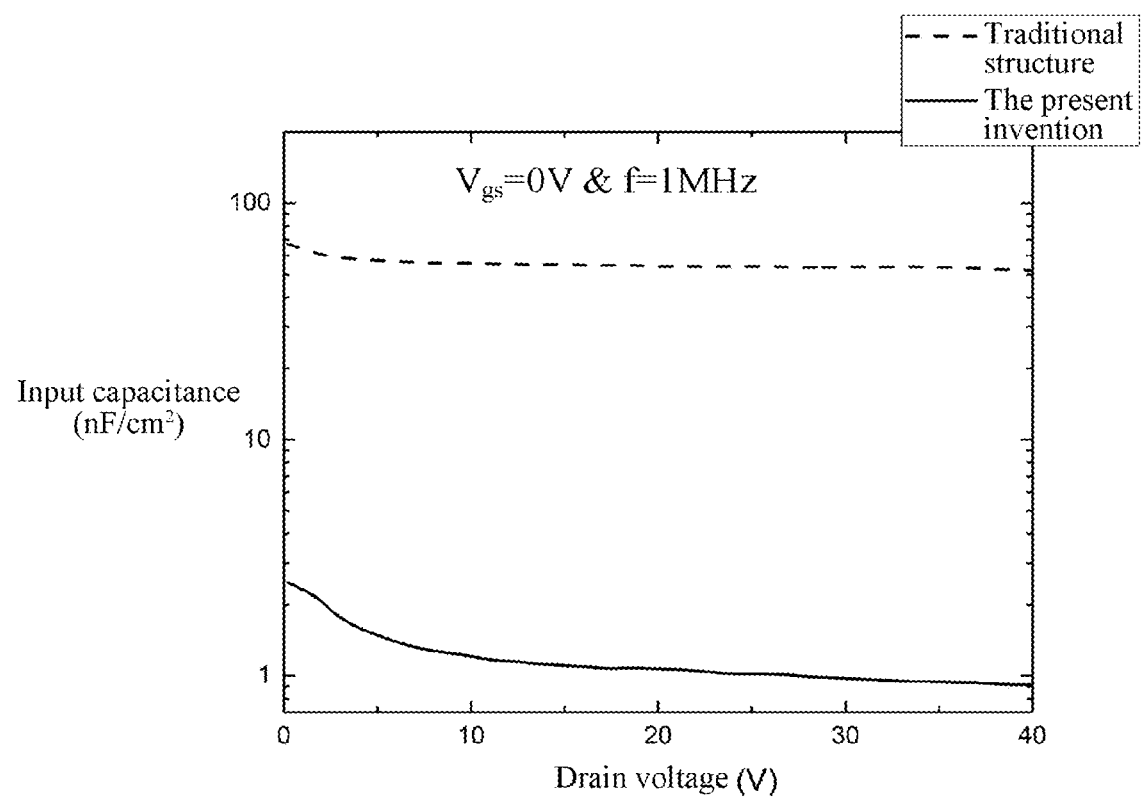
FIG. 19 is a comparison diagram of an input capacitance of the present invention to that of a traditional vertical gallium nitride semiconductor device. It can be seen from the diagram that the input capacitance (Ciss) is reduced by about 93%.

Referring to FIG. 16, this embodiment differs from Embodiment 1 in that a p-ring structure of the high-threshold power semiconductor device is not in a floating state but is grounded.

The specific practices are: Prior to the final passivation step of Embodiment 1, some of the composite column body regions of the cell region 9 and the terminal region 10 are etched and are then filled with metal tungsten 11 short-circuited to the source metal electrode 8. The remaining steps are identical to those in Embodiment 1. The reason for filling the metal tungsten is that tungsten has a higher melting point and good electrical conductivity, so it is not easy to chemically react with other non-metals. By the grounding, in an off-state, depletion layers formed by the columnar p-regions 5a have the same potential. This process can make the potential of part of the p-ring structure not floating, which effectively smooths an electric field at a bottom of a gate and improves the blocking capability of the device.

The working principle and process of the present invention are as follows:

In an equilibrium state of the device, namely, when a voltage of 0 V is applied to the metal gate electrode 7, the metal gate electrode 7 and the conductive channel 6a form a metal-semiconductor contact, and electrons at one side of the conductive channel 6a close to the metal gate electrode 7 are depleted through a Schottky barrier function. At the same time, the columnar p-regions 5a in the channel region assist the depletion of surrounding electrons. The two functions work together to completely deplete the electrons in the conductive channel 6a to achieve the purpose of pinching off the channel. Therefore, a current cannot be formed between the source metal electrode 8 and the metal drain electrode 1, and the device is in an off state. When the voltage of the metal gate electrode 7 starts to increase, electrons near one side of the dielectric layer are gradually accumulated. At the same time, since the potential gradually increases, the depletion layers formed by the columnar p-regions 5a gradually narrow. The two functions work together to form a stable electron conduction channel. A current flows from the source metal electrode 8 through the heavily doped semiconductor layer 5c, the channel layer 6a, the columnar n-regions 5b, the columnar p-regions 5a, the drift region protrusions 4a, the drift region 4, the buffer layer 3 and the substrate 2 successively to reach the metal drain electrode 1, thereby turning on the device.

A skilled person in the art may make various other corresponding changes and deformations according to technical solutions and concepts described above, all the changes and deformations should fall within the protection scope of the claims of the present invention.

What is claimed is:

1. A high-threshold power semiconductor device, comprising:
   a metal drain electrode, a substrate, a buffer layer and a drift region which are stacked from bottom to top, wherein a drift region protrusion protrudes from a partial region of the drift region;
   a columnar p-region and a columnar n-region are provided on the drift region protrusion in sequence;
   a composite column body is formed by the drift region protrusion, the columnar p-region and the columnar n-region;
   a channel layer is provided on an upper surface of the drift region, an outer side of the composite column body and a top of the composite column body;
   a passivation layer is provided on a bottom surface of the channel layer;
   a part of the drift region and a part of the channel layer, the passivation layer and the composite column body thereon are classified into a cell region;
   the other part of the drift region and a part of the channel layer, the passivation layer and the composite column body thereon are classified into a terminal region;
   a dielectric layer is provided on a surface of the passivation layer in the cell region and an outer side of the channel layer;
   a metal gate electrode is provided on an outer side of the dielectric layer;
   a heavily doped semiconductor layer is provided on a top surface of the channel layer in the cell region;
   a source metal electrode is provided on the heavily doped semiconductor layer;
   the passivation layer in the terminal region extends and is wrapped outside the channel layer in the terminal region.

2. The high-threshold power semiconductor device according to claim 1, wherein an upper surface of the passivation layer is not higher than a lower surface of the columnar p-region; an upper surface of the dielectric layer is not higher than an upper surface of the columnar n-region and is not lower than an upper surface of the columnar p-region; the lower surface of the columnar p-region is higher than a lower surface of the metal gate electrode; and an upper surface of the columnar p-region is lower than an upper surface of the metal gate electrode.

3. The high-threshold power semiconductor device according to claim 1, wherein a material of the channel layer is one of gallium nitride, aluminum gallium nitride and a graphene material, a concentration of which is not less than that of the drift region.

4. The high-threshold power semiconductor device according to claim 1, wherein the composite column body is a strip.

5. The high-threshold power semiconductor device according to claim 1, wherein the composite column body is a cylinder, and each composite column body is arranged in a honeycomb shape.

6. A manufacturing method for a high-threshold power semiconductor device according to claim 1, comprising the following steps:
   manufacturing of a wafer: growing a buffer layer and a drift region in sequence on a substrate to prepare a wafer;
   formation of a composite column body in a columnar arrangement: epitaxially forming a p-type semiconductor layer and an n-type semiconductor layer on the drift region in sequence; then etching the p-type semiconductor layer, the n-type semiconductor layer and the drift region to form a composite column body which is arranged in parallel and is composed of a drift region protrusion, a columnar p-region and a columnar n-region which are stacked, wherein an etching depth of the drift region is equal to a thickness of the drift region protrusion; a thickness is 0.8-1.2 times a thickness of the columnar p-region;

manufacturing of a channel layer: depositing a layer of n-type gallium nitride material on an upper surface of the drift region, an outer side of the composite column body and a top of the composite column body by means of atomic layer deposition or chemical vapor deposition to prepare a channel layer;

manufacturing of a passivation layer: depositing a layer of oxide on a bottom of the channel layer by means of atomic layer deposition or chemical vapor deposition to form a passivation layer, wherein an upper surface of the passivation layer is not higher than a lower surface of the columnar p-region; a partial region of the channel layer and the passivation layer thereon are taken as a cell region, and the remaining region of the channel layer and the passivation layer thereon are taken as a terminal region;

manufacturing of a dielectric layer: depositing a layer of high-K dielectric material with a dielectric constant greater than that of silicon dioxide on a surface of the passivation layer and a side wall of the channel layer of the cell region by means of atomic layer deposition or chemical vapor deposition to prepare a dielectric layer, wherein the dielectric layer on the side wall of the channel layer is not higher than the upper surface of the columnar n-region and is not lower than the upper surface of the columnar p-region, and the upper surface at the bottom of the dielectric layer is not higher than the lower surface of the columnar p-region;

manufacturing of a metal gate electrode: depositing a metal on a side wall of the dielectric layer of the cell region by means of magnetron sputtering, so as to prepare a metal gate electrode, wherein an upper surface of the metal gate electrode is not higher than the upper surface of the columnar n-region;

manufacturing of a heavily doped semiconductor layer: depositing a layer of n-type gallium nitride material on a top of the channel layer of the cell region by means of atomic layer deposition or chemical vapor deposition, and heavily doping the n-type gallium nitride material with magnesium ions to prepare a heavily doped semiconductor layer, wherein a doping concentration of the magnesium ions is not less than the concentration of the drift region and is not greater than $2 \times 10^{19} cm^{-3}$;

manufacturing of a source metal electrode: depositing a metal on the heavily doped semiconductor layer of the cell region by means of magnetron sputtering or electron beam evaporation, and forming an ohmic contact with a surface of the heavily doped semiconductor layer to prepare a source metal electrode;

manufacturing of a metal drain electrode: etching or grinding to thin the substrate, depositing a metal on a lower surface of the substrate by means of magnetron sputtering or electron beam evaporation, and forming an ohmic contact with the surface of the substrate to prepare a metal drain electrode; and completion of the extension of the passivation layer: depositing a layer of oxide on a surface of the passivation layer of the terminal region by means of atomic layer deposition or chemical vapor deposition, and causing the upper surface of the further deposited oxide to be not higher than the upper surface of the heavily doped semiconductor layer so that the passivation layer in the terminal region extends and is wrapped outside the channel layer in the terminal region.

7. The manufacturing method according to claim 6, wherein the metal gate electrode adopts a Ni/Au alloy or a Pt/Au alloy.

8. The manufacturing method according to claim 6, wherein the source metal electrode adopts a Ti/Au alloy or a Ti/Al/Ni/Au alloy.

9. The manufacturing method according to claim 6, wherein the dielectric material is gemstone, rutile, calcium titanate or magnesium titanate.

10. The manufacturing method according to claim 6, wherein the high-K dielectric material has a dielectric constant greater than 3.7.

* * * * *